(12) United States Patent
Yoo et al.

(10) Patent No.: US 9,498,907 B2
(45) Date of Patent: Nov. 22, 2016

(54) HOUSING, MANUFACTURING METHOD THEREOF, AND ELECTRONIC DEVICE USING THE SAME

(71) Applicant: Samsung Electronics Co., Ltd., Gyeonggi-do (KR)

(72) Inventors: Hyun-Seok Yoo, Gyeonggi-do (KR); Dong-Wook Kim, Gyeongsangbuk-do (KR); Jae-Chul Jin, Gyeonggi-do (KR); Won-Young Hur, Gyeongsangbuk-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 84 days.

(21) Appl. No.: 14/038,946

(22) Filed: Sep. 27, 2013

(65) Prior Publication Data
US 2014/0146448 A1    May 29, 2014

(30) Foreign Application Priority Data

Nov. 28, 2012    (KR) .................. 10-2012-0135845

(51) Int. Cl.
*B29C 45/14* (2006.01)
*H05K 13/00* (2006.01)
(Continued)

(52) U.S. Cl.
CPC ... *B29C 45/14336* (2013.01); *B29C 45/14811* (2013.01); *G06F 1/1635* (2013.01); *G06F 1/1658* (2013.01); *G06F 1/181* (2013.01); *H04M 1/0249* (2013.01); *H05K 5/0217* (2013.01); *H05K 13/00* (2013.01); *B29C 45/14311* (2013.01); *B29C 45/14786* (2013.01); *B29C 2045/14237* (2013.01); *B29C 2045/14319* (2013.01); *B29K 2069/00* (2013.01); *B29K 2105/0872* (2013.01); *B29K 2669/00* (2013.01);
(Continued)

(58) Field of Classification Search
CPC .............. B29C 45/14811; B29C 2045/14319; B29C 45/14336
See application file for complete search history.

(56) References Cited

U.S. PATENT DOCUMENTS 5,531,950 A * 7/1996 Kimura ............... B29C 37/0078
264/135
5,644,163 A * 7/1997 Tsuji ....................... H01L 23/13
257/705

(Continued)

FOREIGN PATENT DOCUMENTS

CN          101679656 A     3/2010
CN          102514144 A     6/2012
(Continued)

OTHER PUBLICATIONS

European Search Report dated Apr. 22, 2016.
(Continued)

*Primary Examiner* — Matthew Daniels
(74) *Attorney, Agent, or Firm* — Cha & Reiter, LLC

(57) ABSTRACT

Provided is a method of manufacturing a housing of an electronic device. The method includes manufacturing a housing body by successively stacking a composite material sheet with a plastic sheet applied to at least one surface of a top and a bottom surfaces of the composite material sheet and molding a plastic injection-molded product on the plastic sheet of the housing body through insert molding to connectively affix the composite material sheet with the housing body and the plastic sheet.

19 Claims, 14 Drawing Sheets

(51) Int. Cl.
    *H05K 5/02*         (2006.01)
    *G06F 1/16*         (2006.01)
    *G06F 1/18*         (2006.01)
    *B29L 31/34*        (2006.01)
    *B29K 669/00*       (2006.01)
    *B29K 69/00*        (2006.01)
    *H04M 1/02*        (2006.01)
    *B29K 105/08*       (2006.01)

(52) U.S. Cl.
    CPC . *B29L 2031/3437* (2013.01); *B29L 2031/3481* (2013.01); *H04M 1/0252* (2013.01)

(56) References Cited

U.S. PATENT DOCUMENTS

| | | |
|---|---|---|
| 9,139,242 B2 | 9/2015 | Weiss et al. |
| 2002/0013132 A1* | 1/2002 | Newstead et al. ............. 455/90 |
| 2002/0106952 A1* | 8/2002 | Hashizume et al. ............ 442/43 |
| 2002/0176979 A1* | 11/2002 | Evans ........................ 428/292.1 |
| 2009/0136708 A1* | 5/2009 | Huang ................ B29C 45/1418 |
| | | 428/113 |
| 2010/0143648 A1 | 6/2010 | Tsai et al. |
| 2013/0033158 A1 | 2/2013 | Schmidt et al. |

FOREIGN PATENT DOCUMENTS

| | | |
|---|---|---|
| DE | 20 2011 103 932 U1 | 1/2013 |
| JP | 2002-254469 A | 9/2002 |
| KR | 10-2009-0024410 A | 3/2009 |
| KR | 10-2012-0000063 A | 1/2012 |

OTHER PUBLICATIONS

Chinese Search Report, dated Jul. 12, 2016.

* cited by examiner

HOUSING, MANUFACTURING METHOD THEREOF, AND ELECTRONIC DEVICE USING THE SAME

CLAIM OF PRIORITY

This application claims priority under 35 U.S.C. §119 to an application filed in the Korean Intellectual Property Office on Nov. 28, 2012 and assigned Serial No. 10-2012-0135845, the contents of which are incorporated herein by reference in its entirety.

BACKGROUND

1. Field of the Invention

The present disclosure relates generally to a housing defining an exterior of an electronic device and the electronic device thereof.

2. Description of the Related Art

Recently, due to the development of electronic communication industries, electronic devices such as mobile communication terminals (cellular phones), electronic notes, personal digital assistants (PDAs), televisions, lap-top computers, and the like has become a necessity of modern society and serves as an important means for information transmission that is rapidly changing. Such an electronic device facilitates user working through a graphic user interface (GUI) environment using a touch screen and provides various multimedia based on web environments.

Also, the electronic device is designed to have a shape and exterior suitable for user's tastes and preference. In recent, as the trend of preference of an elegant exterior increases, methods and effects for elegantly manufacturing a housing defining an exterior of an electronic device are difficult and competitive.

In recent years, a housing are typically molded using composite materials. The composite materials are constituted by combing two kinds of base materials. That is, the composite materials are artificial materials having superior properties that are unobtainable from a single material. The composite materials may improve various properties such as strength, stiffness, corrosion resistance, fatigue, wear resistance, impact resistance, weight reduction, and the like when compared to other materials.

Particularly, when a detachable housing is molded using the composite materials, a housing body is molded first, and then a post-treatment process for molding a plastic injection-molded product on an inner surface of the housing body through insert molding is performed. The plastic injection-molded product may have a snap-fit on an edge thereof. The snap-fit is configured to bind the housing to the electronic device. Typically, the insert molding is performed after the inner surface of the housing body is coated with an adhesive such as bond, glue or binder. Thus, a bonding force between the plastic injection-molded product and the housing body may increases. However, even though the housing body and the plastic injection-molded product are bonded using the adhesive, it is difficult to secure uniform bonding strength at a bonded portion. As a result, hetero-materials may cause bending, twisting, and breaking due to their different materials properties. Furthermore, in spite of the completed housing body, it is difficult to secure yield because of an occurrence of defects in the post-treatment process in which the inner surface of the housing body is coated with the adhesive.

Also, a post-treatment process for an elegant exterior such as coloring, dyeing, or depositing may be further performed on an outer surface of the housing body. In spite of the completed housing body, there is disadvantageous for securing yield of the post-treatment process.

As a result, in spite of the completed housing body for the housing, defect possibility is lurking or obscured in the post-treatment processes for the completed housing body. Thus, the housing treatment method according to the related art is undesirable.

SUMMARY

The present invention substantially solve at least some of the above problems and/or disadvantages and provides at least the advantages below.

Accordingly, one aspect of the present invention is to provide a housing of an electronic device having an elegant exterior and a method of manufacturing the same.

Another aspect of the present invention is to provide a detachable housing of an electronic device and a method of manufacturing the same.

Another aspect of the present invention is to provide a housing of an electronic device and a method of manufacturing the same without reducing the number of post-treatment processes.

Another aspect of the present invention is to provide a housing of an electronic device and a method of manufacturing the same without performing a process of applying an adhesive such as bond or binder to a composite material sheet when insert molding is performed on the composite material sheet.

Another aspect of the present invention is to provide a housing of an electronic device in which, when a post-treatment process for attaching a plastic injection-molded product to a composite material sheet through insert molding is performed, a defect rate is reduced to improve a bonding force between the composite material sheet and the plastic injection-molded product and a method of manufacturing the same.

Another aspect of the present invention is to provide a housing of an electronic device and a method of manufacturing the same without performing a surface post-treatment process such as coloring, dyeing, or depositing.

According to an aspect of the present invention, a method of manufacturing a housing of an electronic device includes: manufacturing a housing body by successively stacking a composite material sheet with a plastic sheet stacked on a composite material sheet wherein the plastic sheet is applied to at least one surface of a top and a bottom surfaces of the composite material sheet; and; and molding a plastic injection-molded product on the plastic sheet of the housing body through insert molding o connectively affix the composite material sheet with the housing body and the plastic sheet.

According to another aspect of the present invention, a method of manufacturing a housing of an electronic device includes: manufacturing a housing body with a surface-treated sheet is stacked on a composite material sheet; applying an adhesive to the composite material sheet of the housing body; and molding a plastic injection-molded product on the composite material sheet, to which the adhesive is applied, through insert molding to connectively affix the composite material sheet with the housing body and the plastic sheet.

According to another aspect of the present invention, a method of manufacturing a housing of an electronic device includes: manufacturing a housing body in which a surface-treated sheet and a plastic sheet are successively stacked on a top and a bottom surface of a composite material sheet; and molding a plastic injection-molded product on the plastic sheet of the housing body through insert molding to connectively affix the composite material sheet with the housing body and the plastic sheet.

According to another aspect of the present invention, a method of manufacturing a housing of an electronic device includes: molding a composite material sheet in which at least one fiber base material is stacked on one of the at least one surface of the top and the bottom of the plastic sheet; manufacturing a housing body from the composite material sheet; and molding a plastic injection-molded product on the plastic sheet of the housing body through insert molding.

According to another aspect of the present invention, a method of manufacturing a housing of an electronic device includes: molding a composite material sheet in which at least one fiber base material is stacked on a bottom surface of a surface-treated sheet; manufacturing a housing body from the composite material sheet; applying an adhesive to a bottom surface of the housing body; and molding a plastic injection-molded product on the bottom of the bottom surface of the housing body, to which the adhesive is applied, through insert molding.

According to another aspect of the present invention, a method of manufacturing a housing of an electronic device includes: molding a composite material sheet in which at least one fiber base material is disposed between a surface-treated sheet and a plastic sheet; manufacturing a housing body from the composite material sheet; and molding a plastic injection-molded product on the plastic sheet of the housing body through insert molding to form a unitary component.

According to another aspect of the present invention, an electronic device includes: a plurality of electronic components; and at least one housing accommodating the electronic components, wherein the housing includes: a housing body in which at least one fiber base material is successively stacked on a plastic sheet; and a plastic injection-molded product molded on the plastic sheet of the housing body through insert molding to form a unitary component.

According to another aspect of the present invention, an electronic device includes: a plurality of electronic components; and at least one housing accommodating the electronic components, wherein the housing includes: a housing body in which at least one fiber base material is successively stacked on a bottom surface of a surface-treated sheet; and a plastic injection-molded product molded on a bottom surface of the housing body, to which an adhesive is applied, through insert molding.

According to another aspect of the present invention, an electronic device, wherein, the plastic injection-molded product and the plastic sheet are formed of the same material.

The surface treatment may include at least one of coloring, dyeing, and depositing.

The surface-treated sheet includes a sheet on which at least one of Sn, Si, and In is deposited.

The plastic injection-molded product may have snap-fits disposed along a circumference of the housing body so that the snap-fits are detachably coupled to a coupling groove defined in a rear housing of the electronic device.

According to another aspect of the present invention, an electronic device includes: a plurality of electronic components; and at least one housing accommodating the electronic components, wherein the housing includes: a housing body in which at least one fiber base material is disposed between a surface-treated sheet and a plastic sheet; and a plastic injection-molded product molded on the plastic sheet of the housing body through insert molding.

According to another aspect of the present invention, an electronic device includes: a front housing disposed on a front side of the electronic device; a rear housing coupled to the front housing to provide a space between the front housing and the rear housing for accommodating a plurality of electronic components of the electronic device; and a detachable rear cover disposed on a rear side of the electronic device, the detachable rear cover being coupled to the rear housing to provide a space accommodating a battery between the rear housing and the rear cover, wherein the rear cover includes: a body manufactured by successively stacking a composite material sheet with a plastic sheet is applied to each of a top and a bottom surfaces of the composite material sheet; and a plastic injection-molded product molded on the plastic sheet disposed on the bottom surface of the body through insert molding to connectively affix the composite material sheet with the housing body and the plastic sheet, the plastic injection-molded product having snap-fits on a circumference thereof so that the snap-fits are detachably coupled to a coupling groove defined in the rear housing, wherein the plastic sheet is a surface-thermoplastic sheet and wherein the surface-treated plastic sheet adhering to the housing body is disposed on the top surface of the body includes a surface-treated sheet, and wherein the plastic sheet disposed on the bottom surface of the body and the plastic injection-molded product are the same material, and a bonded portion between the plastic sheet and the plastic injection-molded product is thermally fused to connectively affix the composite material sheet with the housing body and the plastic sheet.

BRIEF DESCRIPTION OF THE DRAWINGS

The above features and advantages of the present invention will become more apparent from the following detailed description when taken in conjunction with the accompanying drawings in which.

DETAILED DESCRIPTION

Exemplary embodiments of the present invention will be described herein below with reference to the accompanying drawings to assist in a comprehensive understanding of exemplary embodiments of the invention as defined by the claims and their equivalents. For the purposes of clarity and simplicity, well-known functions or constructions are not described in detail as they would obscure the understanding of the subject matter of the present invention in unnecessary detail by a person of ordinary skill in the art with unnecessary detail of the well-known functions and structures.

Preferred embodiments of the present invention will be described herein below with reference to the accompanying drawings. In the following description, detailed descriptions of well-known functions or constructions will be omitted since they would obscure the invention in unnecessary detail. Also, the terms used herein are defined according to the functions of the present invention. Thus, the terms may vary depending on user's or operator's intentions or practices. Therefore, the terms used herein must be understood based on the descriptions made herein.

Therefore, the terms used herein should be understood based on the descriptions made herein in view of the ordinary level of skill in the art. The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

Figure 1A:
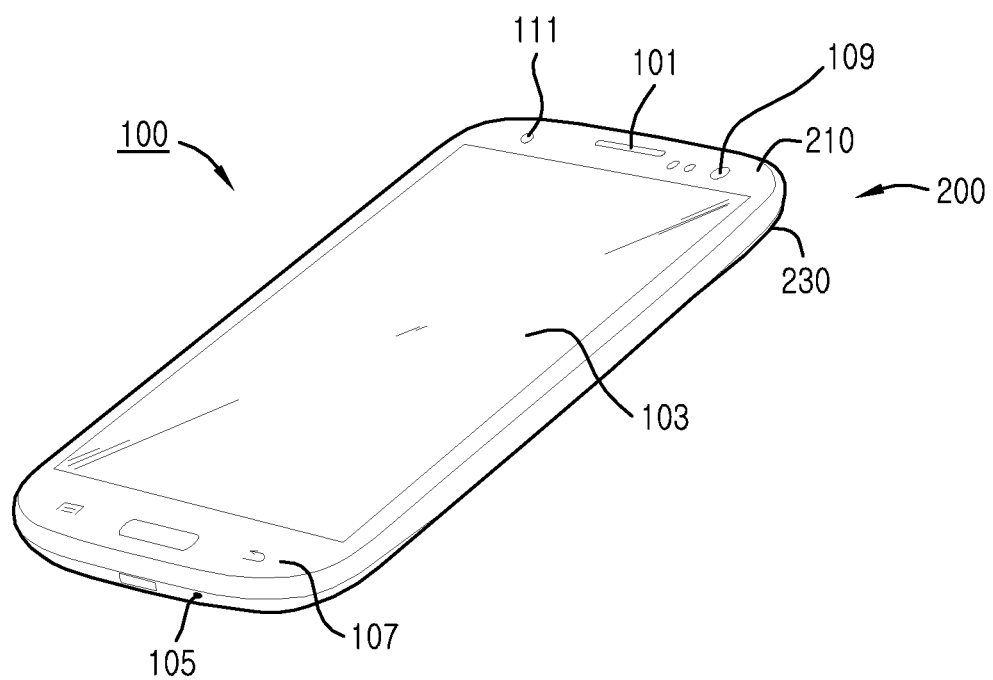
FIGS. 1A to 1B are perspective views of the front and rear of an electronic device according to an embodiment of the present invention.
Figure 1B:
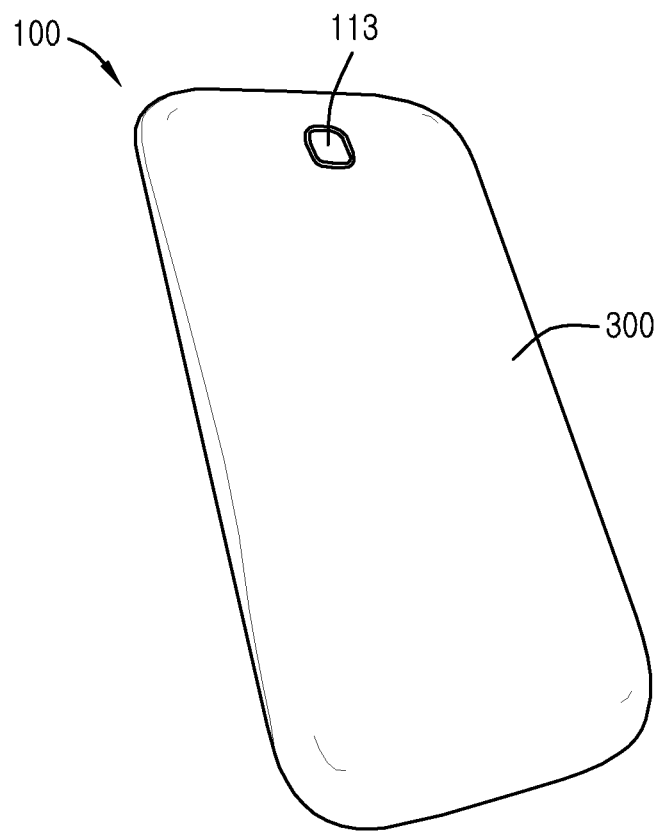
Figure 1C:
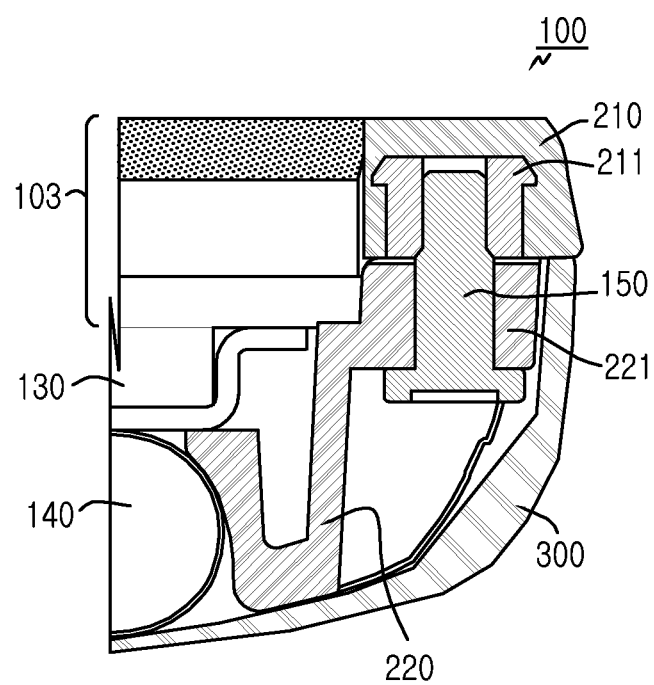
FIG. 1C is a cross-sectional view illustrating a structure of the electronic device according to an embodiment of the present invention.

FIGS. 1A to 1B are perspective views of an electronic device according to an embodiment of the present invention, and FIG. 1C is a cross-sectional view illustrating a structure of the electronic device according to an embodiment of the present invention.

Referring to FIGS. 1A to 1C, an electronic device 100 includes a speaker unit 101 outputting sounds, a touch screen unit 103 disposed under the speaker unit 101 to display an image and receive a touch input, a microphone unit 105 disposed below the touch screen unit 103 to receive the sounds, a keypad or button unit 107 on which input buttons are disposed, a front camera unit 109, and a rear camera unit 113.

The electronic device 100 includes a housing 200 defining an exterior. The above-described components may be accommodated within the housing 200. The housing 200 includes a front housing 210, a rear housing 220, and a rear cover 300.

The front housing 210 and the rear housing 220 are coupled to each other to provide a space for accommodating the internal components of the electronic device 100. The rear cover 300 covers the rear housing 220. The front housing 210 is disposed on a front surface of the electronic device 100, and the rear cover 300 is disposed on a rear surface of the electronic device 100.

The front housing 210 and the rear housing 220 are coupled to provide a space having a container shape and opened in a front direction of the electronic device 100. The touch screen unit 103 is disposed on a main board 130 and includes both a window and a display. The touch screen unit 103 and the main board 130 are mounted within the accommodation space defined by coupling the front housing 210 to the rear housing 220. A battery 140 is accommodated in a space defined by coupling the rear housing 220 to the rear cover 300.

The window is transparent and exposed to a front side of the electronic device 100 to allow viewing of images, text and graphics on the display. An image displayed on the display is shown through the window. The main board is a board on which a basic circuit and a plurality of electronic components are mounted. The main board may set an execution environment of the electronic device 100 and maintain information with respect to the electronic device 100 so that the electronic device 100 stably operates, and a data input/output of all units of the electronic device 100 is smoothly executed.

The front housing 210 together with the rear housing 220 provides a boss 211 for screw-coupling. The boss 211 includes a screw coupling part in which a screw hole to be coupled to a screw is defined. The screw coupling part is formed of a metal. When injection molding is performed, the screw coupling part is disposed within the boss 211. The rear housing 220 has a boss coupling hole 221 to be coupled to the boss 211 of the front housing 210. A screw 150 passes through the rear housing 220 and the boss coupling hole 221 and is coupled to the boss 211 of the front housing 210 to couple the front housing 210 to the rear housing 220.

Figure 1D:
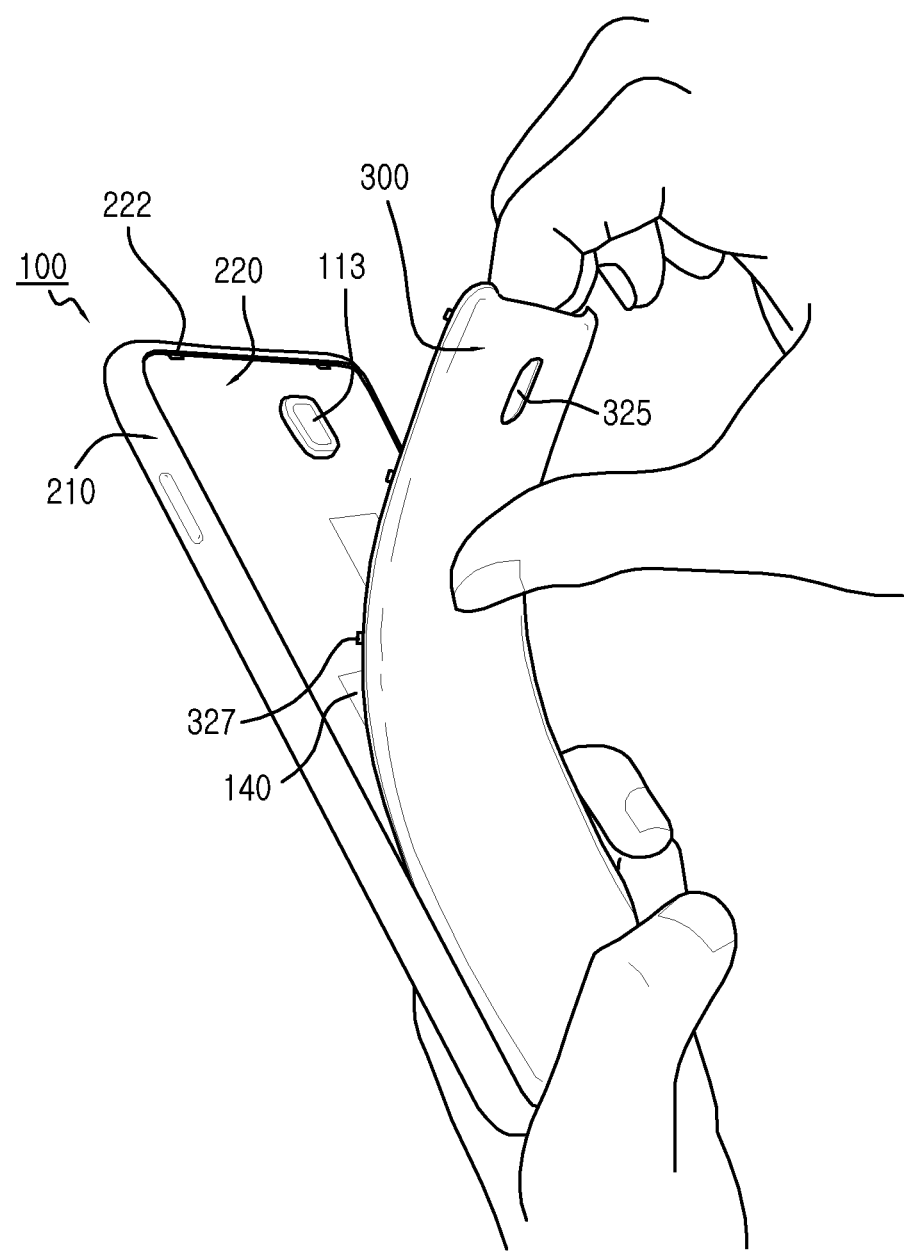
FIG. 1D is a view illustrating a state in which a rear cover of the electronic device is detached according to an embodiment of the present invention.

FIG. 1D is a view illustrating a state in which a rear cover of the electronic device is partially detached according to an embodiment of the present invention. The rear cover 300 may be coupled to the rear housing 220 or separated from the rear housing 220. The rear cover 300 has a snap-fit 327 in an edge thereof The rear housing 220 has a coupling groove 222 in an edge thereof to correspond to the snap-fit 327. When the rear housing 220 and the rear cover 300 are coupled to each other, the snap-fit is coupled to the coupling groove 222. When the rear cover 300 is coupled to or separated from the rear housing 220, the rear cover 300 may be elastically bent and deformed as shown in FIG. 1D. Also, the rear cover 300 has an opened opening for exposing the camera unit 113 accommodated in the front and rear housings 210 and 220.

Figure 2:
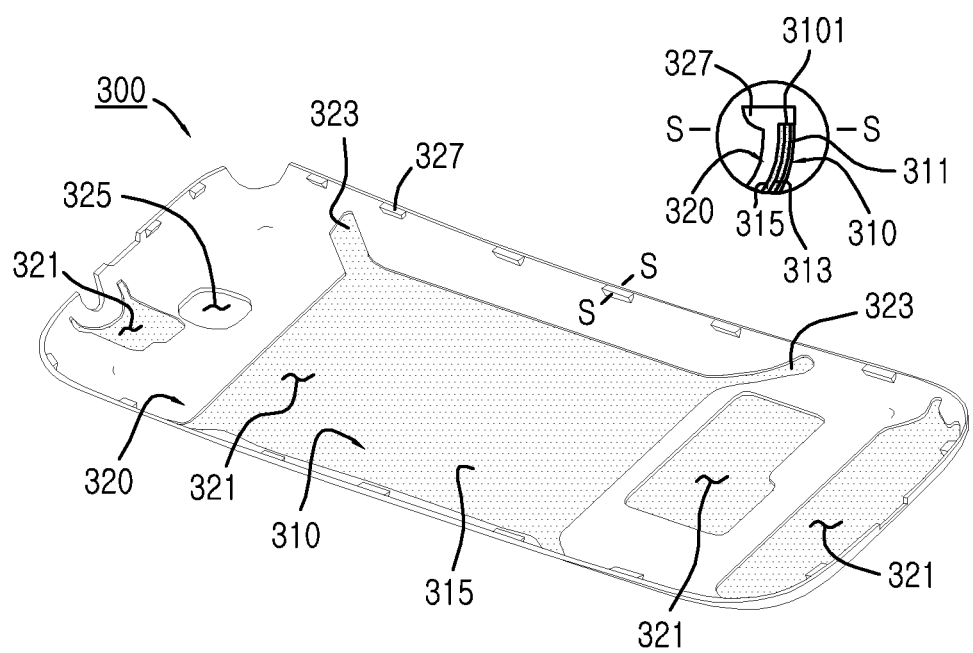
FIG. 2 is a perspective view of the inside of the rear cover of the electronic device according to an embodiment of the present invention.

FIG. 2 is an inner perspective view of the rear cover of the electronic device according to an embodiment of the present invention.

Referring to FIG. 2, the rear cover 300 includes a housing body 310 and a plastic injection-molded product 320 molded on an inner surface of the housing body 310 by insert molding. The plastic injection-molded product 320 may be insert-molded to extend up to an end 3101 of the housing body 310. The plastic injection-molded product 320 may solve limitations such as breaking and tearing that may occur when the rear cover 300 is constituted by only the housing body 310.

The housing body 310 includes a surface-treated sheet 311 disposed on the outside thereof, a plastic sheet 315 disposed on the inside thereof, and a composite material sheet disposed between the surface-treated sheet 311 and the plastic sheet 315. The sheets adhere to each other.

The plastic injection-molded product 320 is formed of the same material as that plastic sheet 315 disposed on the inside of the housing body 310. Thus, a bonded portion between the plastic sheet 315 and the plastic injection-molded product 320 may be firmly thermally fused (thermally bonded) to each other when the insert molding is performed. That is, when the insert molding is performed, it is unnecessary to perform a process of applying a separate adhesive to attach the plastic injection-molded product to the inner surface of the housing body 310. The plastic sheet 315 of the housing body 310 may include a polymer sheet formed of at least one of Polycarbonate (PC), nylon, acrylic, polyethyleneterephthalate (PET), and epoxy.

Also, the surface-treated sheet 311 disposed on the outside of the housing body 310 may be exposed to the outside of the electronic device 100. A surface post-treatment process for an elegant exterior such as coloring, dyeing, or depositing has been previously performed on the surface-treated sheet 311. Thus, a separate surface post-treatment process is unnecessary. The surface-treated sheet 311 may include a sheet on which Sn, Si, Ti, or In may be deposited.

The plastic injection-molded product includes the snap-fit 327 coupled to the coupling grove 222 of the rear housing 220. Particularly, an injection-molded product is not disposed on portions 321 overlapping electronic components such as a battery, an antenna, and a speaker to provide a space for securing performance of the electronic components.

Furthermore, the plastic injection-molded product 320 may be insert-molded to a periphery of the edge of the housing body 310 or insert-molded so that the slits 323 are respectively defined in circumferences, particularly, edge of the portions 321 on which the injection-molded product is not disposed. Thus, the deformation of the rear cover 300 due to contraction of the plastic injection-molded product 320 may be prevented to secure stability in dimension.

Figure 3A:
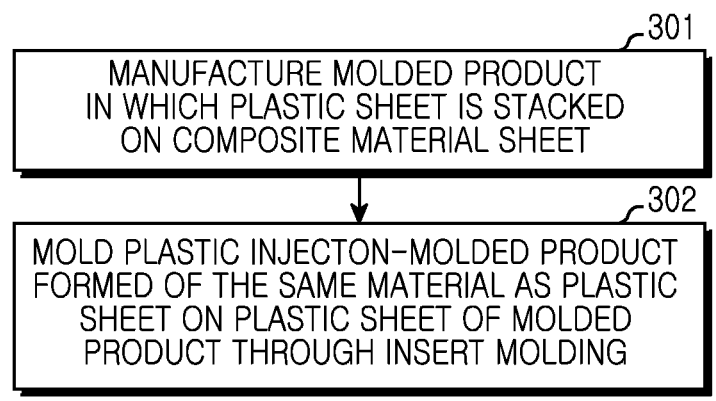
FIGS. 3A, 3B and 3C are flowcharts illustrating a process of manufacturing a housing according to an embodiment of the present invention.

FIG. 3A is a flowchart illustrating a process of manufacturing a housing according to an embodiment of the present invention.

Referring to FIG. 3A, in operation S301, a housing body in which a plastic sheet is stacked on a composite material sheet is manufactured. That is, after the composite material sheet and the plastic sheet are stacked on each other, the stacked composite material and plastic sheets may be compression-molded by using a mold to manufacture the housing body having a shape corresponding to that of the mold. Alternatively, after a surface-treated sheet, the composite material sheet, and the plastic sheet are successively stacked on each other, the stacked surface-treated sheet, composite material sheet, and plastic sheet may be autoclave-molded by using an autoclave to manufacture the housing body having a shape corresponding to that of the autoclave mold.

In operation S302, a plastic injection-molded product formed of the same material as the plastic sheet is molded on the plastic sheet of the housing body through insert molding. Since the plastic sheet of the housing body and the plastic material for insert-molding are formed of the same material, when the insert molding is performed, a bonded portion between the plastic sheet and the plastic injection-molded product may be thermally fused by heat, and thus the plastic sheet and the plastic injection-molded product may be connectively bonded to each other. When the insert molding is performed, it is unnecessary to perform a separate process of applying an adhesive to attach the plastic injection-molded product to the housing body.

Figure 3B:
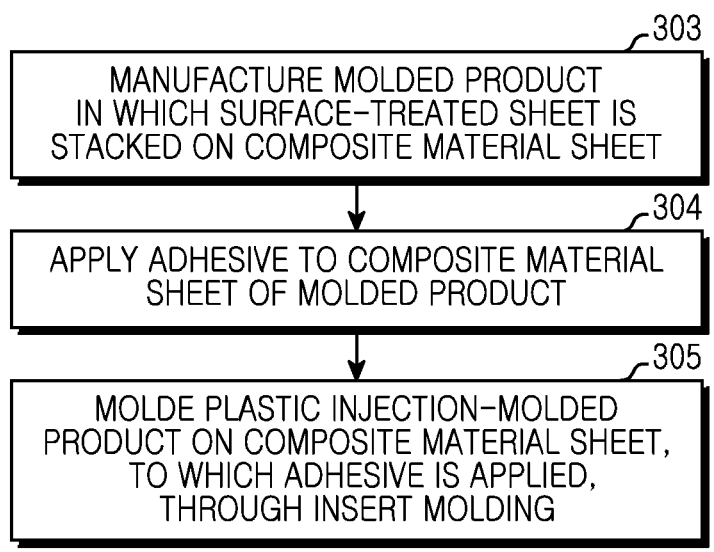

FIG. 3B is a flowchart illustrating a process of manufacturing the housing according to an embodiment of the present invention.

Referring to FIG. 3B, in operation S303, a housing body in which a surface-treated sheet is stacked on a composite material sheet is manufactured. That is, after the composite material sheet and the surface-treated sheet are stacked on each other, the composite material sheet and the plastic sheet are compression-molded by using a mold to manufacture the housing body having a shape corresponding to that of the mold. Since the housing body includes the surface-treated sheet defining an exterior thereof, it is unnecessary to perform a separate surface post-treatment process.

In operation S304, an adhesive is applied on the composite material sheet of the housing body in other words the adhesive is applied between the composite material and the molded product.

In operation S305, a plastic injection-molded product is molded on the composite material sheet, to which the adhesive is applied, through insert molding. The plastic injection-molded product molded through the insert molding and the composite material sheet are attached to each other by using the adhesive as a medium.

Figure 3C:
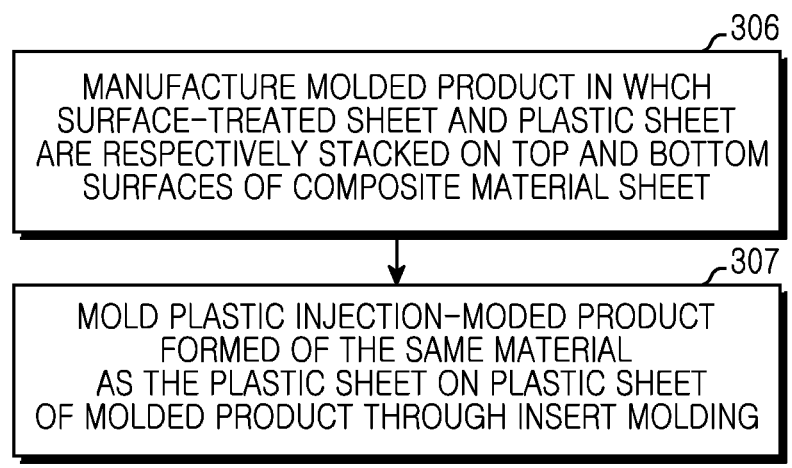

FIG. 3C is a flowchart illustrating a process of manufacturing the housing according to an embodiment of the present invention.

Referring to FIG. 3C, in operation S306, a housing body in which a surface-treated sheet and a plastic sheet are respectively stacked on top and bottom surfaces of a composite material sheet is manufactured. That is, after the surface-treated sheet, the composite material sheet, and the plastic sheet are successively stacked on each other, the stacked surface-treated sheet, composite material sheet, and plastic sheet are compression-molded by using a mold to manufacture the housing body having a shape corresponding to that of the mold. Alternatively, after a surface-treated sheet, the composite material sheet, and the plastic sheet are successively stacked on each other, the stacked surface-treated sheet, composite material sheet, and plastic sheet may be autoclave-molded by using an autoclave to manufacture the housing body having a shape corresponding to that of the autoclave mold. The plastic sheet is disposed on the inside of the housing body, and the surface-treated sheet is disposed on the outside of the housing body. Since the surface-treated sheet is disposed on the outside of the housing body, a separate surface post-treatment process is unnecessary.

In operation S307, a plastic injection-molded product formed of the same material as the plastic sheet is molded on the plastic sheet through insert molding. As described above, since the plastic sheet disposed on the inside of the housing body and the plastic material for insert-molding are formed of the same material, when the insert molding is performed, a bonded portion between the plastic sheet and the plastic injection-molded product may be thermally fused by heat, and thus the plastic sheet and the plastic injection-molded product may be connectively bonded to each other. When the insert molding is performed, it is unnecessary to perform a separate process of applying an adhesive to attach the plastic injection-molded product to the housing body.

Figure 4:
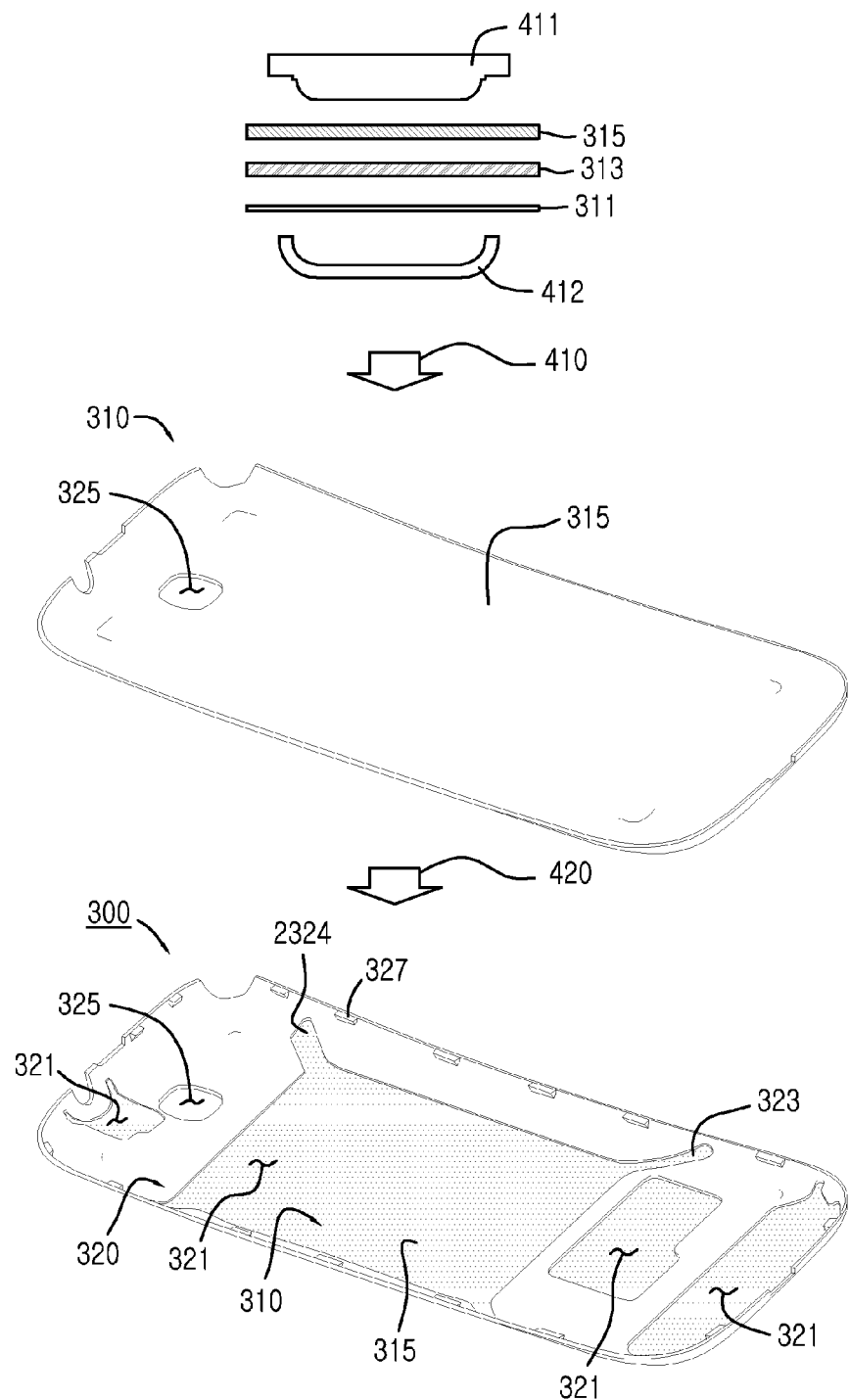
FIG. 4 is a view illustrating a process of manufacturing a housing according to an embodiment of the present invention.

FIG. 4 is a view illustrating a process of manufacturing the housing according to an embodiment of the present invention.

Referring to FIG. 4, a mold includes a cavity retainer plate (an upper concave circular plate) 412 and a core retainer plate (a lower convex circular plate) 411. The cavity retainer plate 412 has an empty space having a concave shape, i.e., a cavity. The core retainer plate 411 includes a convex shape, i.e., a core. When the core retainer plate 411 moves and then is coupled to the cavity retainer plate 412, the cavity and the core are coupled to each other to provide a molding space for molding a product.

A surface-treated sheet 311, a composite material sheet 313, and a plastic sheet 315 are successively stacked on each other. Then, the stacked surface-treated sheet, composite material sheet, and plastic sheet 311, 313, and 315 are disposed between the cavity retainer plate 412 and the core retainer plate 411 to perform a compression molding process 410, thereby molding a housing body 310 having a corresponding shape to the cavity retainer plate 412 and the core retainer plate 411. The plastic sheet 315 is disposed on the inside of the housing body 310, and the surface-treated sheet 311 is disposed on the outside of the housing body 310. Also, the housing body 310 has an opening 325 exposing a rear camera unit 113. The housing body 310 may be compression-molded by using the above-described mold or autoclave-molded by using an autoclave.

A plastic injection-molded product 320 is attached to the inside of the housing body 310 through insert molding to manufacture a housing 300. Since the molten plastic used for the insert molding is formed of the same material as the plastic sheet 315 disposed on the inside of the housing body 310, when the insert molding is performed, a bonded portion between the plastic sheet 315 and the plastic injection-molded product 320 are thermally fused. That is, when the insert molding is performed, it is unnecessary to perform a process of applying a separate adhesive to attach the plastic injection-molded product 320 to the inner surface of the housing body 310.

Figure 5:
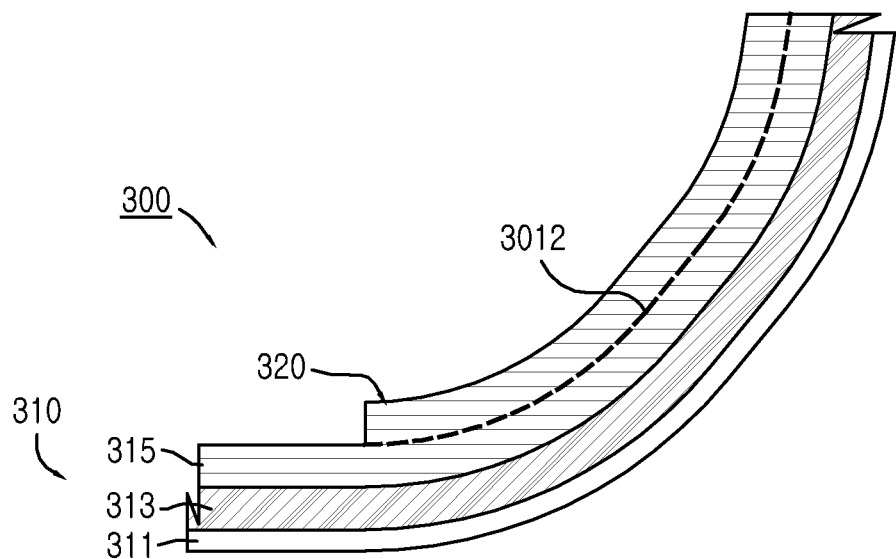
FIG. 5 is a cross-sectional view illustrating a constitution of the housing according to an embodiment of the present invention.

FIG. 5 is a cross-sectional view illustrating a constitution of a housing according to an embodiment of the present invention.

Referring to FIG. 5, a housing 300 includes a housing body 310 and a plastic injection-molded product 320 attached to an inner surface of the housing body 310 through insert molding.

A plastic sheet 315 is disposed on an inner surface of the housing body 310, and a surface-treated sheet 311 is disposed on an outer surface of the housing body 310. A composite material sheet 313 is disposed between the plastic sheet 315 and the surface-treated sheet 311.

The plastic injection-molded product 320 is formed of the same material as that plastic sheet 315 disposed on the inner surface of the housing body 310. Thus, a bonded portion between the plastic sheet 315 and the plastic injection-molded product 320 may be more firmly thermally fused with each other when the insert molding is performed. That is, when the insert molding is performed, it is unnecessary to perform a process of applying a separate adhesive to attach the plastic injection-molded product to the inner surface of the housing body 310 and thereby a unitary component can be more readily formed.

Also, the surface-treated sheet 311 disposed on the outside of the housing body 310 may be exposed to the outside of the electronic device 100. A surface post-treatment process for an elegant exterior such as coloring, dyeing, or depositing has been previously performed on the surface-treated sheet 311. Thus, a separate surface post-treatment process is unnecessary.

Figure 6A:
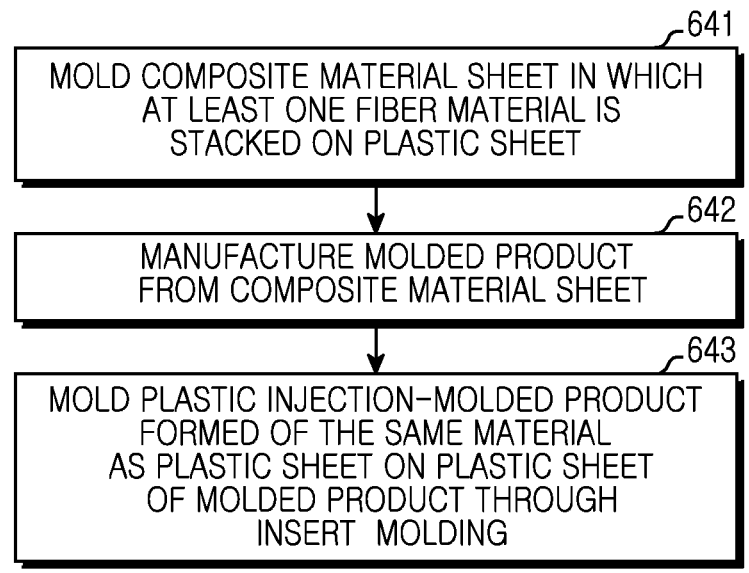
FIGS. 6A, 6B and 6C are flowcharts illustrating a process of manufacturing a housing according to an embodiment of the present invention.

FIG. 6A is a flowchart illustrating a process of manufacturing the housing according to an embodiment of the present invention.

Referring to FIG. 6A, in operation S641, a composite material sheet in which at least one fiber base material is stacked on a plastic sheet is molded. In the method of molding the composite material sheet, a hot press or autoclave process that is well known may be performed to attach a surface-treated sheet, the fiber base material, and the plastic sheet to each other. The fiber base material may include at least one of a glass fiber base material, a Kevlar fiber base material, and a basalt fiber base material. Particularly, the fiber base material may include preimpregnated materials (prepreg) which are well known. The prepreg may be manufactured in a thin film shape by using a reinforced fiber and a matrix impregnated in the reinforced fiber. The reinforced fiber of the prepreg may include one of carbon fiber, glass fiber, and aramid fiber, and the matrix may include one of an epoxy resin, a polyester resin, and a thermoplastic resin. The prepreg may form various product groups according to a kind and arrangement configuration of fiber and a kind of used matrix. Also, the prepreg may include at least one of unidirectional prepreg, plain weave prepreg, twill woven prepreg, and satin weave prepreg or other types of prepreg material known in the art.

In operation S642, a housing body is manufactured from the composite material sheet. The housing body is manufactured in a three-dimensional plate shape by using a mold as a compression molding unit.

In operation S643, a plastic injection-molded product formed of the same material as the plastic sheet is molded on the plastic sheet of the housing body through insert molding. Since the molten plastic used for the insert molding is formed of the same material as the plastic sheet of housing body, when the insert molding is performed, a bonded portion between the plastic sheet and the plastic injection-molded product are thermally fused. When the insert molding is performed, it is unnecessary to perform a separate process of applying an adhesive to attach the plastic injection-molded product to the housing body.

Figure 6B:
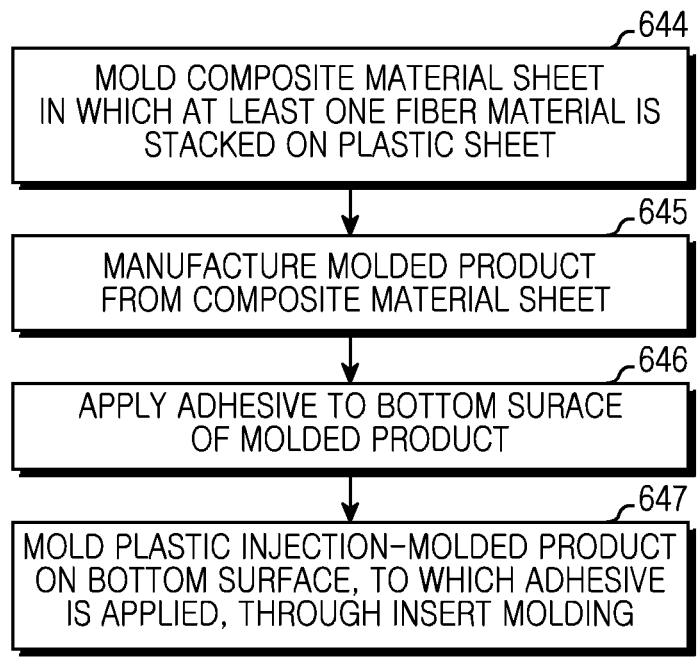

FIG. 6B is a flowchart illustrating a process of manufacturing the housing according to an embodiment of the present invention.

Referring to FIG. 6A, in operation S641, a composite material sheet in which at least one fiber base material is stacked on a plastic sheet is molded. In the method of molding the composite material sheet, a hot press or autoclave process that is well known may be performed to attach a surface-treated sheet and the fiber base material to each other. The fiber base material may include at least one of a glass fiber base material, a Kevlar fiber base material, and a basalt fiber base material. Particularly, the fiber base material may include preimpregnated materials (prepreg) which are well known. The prepreg may be manufactured in a thin film shape by using a reinforced fiber and a coupling material impregnated in a reinforced fiber. The reinforced fiber of the prepreg may include one of carbon fiber, glass fiber, and aramid fiber, and the matrix may include one of an epoxy resin, a polyester resin, and a thermoplastic resin. The prepreg may form various product groups according to a kind and arrangement configuration of fiber and a kind of used matrix. Also, the prepreg may include at least one of unidirectional prepreg, plain weave prepreg, twill woven prepreg, and satin weave prepreg or other types of prepreg material known in the art.

In operation S645, a housing body is manufactured from the composite material sheet. The housing body is manufactured in a three-dimensional plate shape by using a mold as a compression molding unit. Since a post-treatment process such as such as coloring, dyeing, or depositing is previously performed on the surface-treated sheet to realize an elegant exterior, and then the surface-treated sheet defines the exterior of the housing body, a separate surface post-treatment process is unnecessary.

In operation S646, an adhesive is applied to a bottom surface of the housing body.

In operation S647, a plastic injection-molded product is molded on the bottom surface of the housing body, to which the adhesive is applied, through insert molding. The plastic injection-molded product molded through the insert molding and the bottom surface of the housing body are attached to each other by using the adhesive as an attachment medium.

Figure 6C:
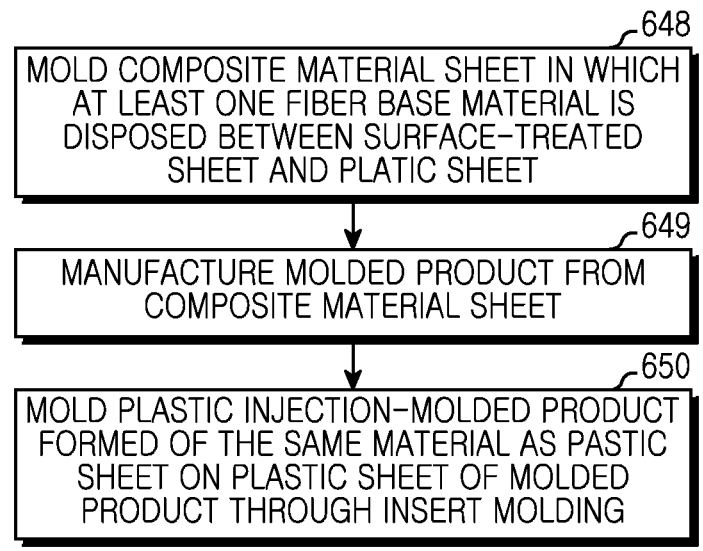

Referring to FIG. 6C, in operation S648, a composite material sheet in which a plurality of fiber base materials are disposed between the surface-treated sheet and the plastic sheet is molded. In the method of molding the composite material sheet, a hot press or autoclave process that is well known may be performed to attach a surface-treated sheet, the fiber base material, and the plastic sheet to each other. The fiber base material may include at least one of a glass filer base material, a Kevlar fiber material, and a basalt fiber base material. Particularly, the fiber base material may include preimpregnated materials (prepreg) which are well known. The prepreg may be manufactured in a thin film shape by using a reinforced fiber and a matrix impregnated in the reinforced fiber. The reinforced fiber of the prepreg may include one of carbon fiber, glass fiber, and aramid fiber, and the matrix may include one of an epoxy resin, a polyester resin, and a thermoplastic resin. The prepreg may form various product groups according to a kind and arrangement configuration of fiber and a kind of used matrix. Also, the prepreg may include at least one of unidirectional prepreg, plain weave prepreg, twill woven prepreg, and satin weave prepreg or other types of prepreg material known in the art.

In operation S649, a housing body is manufactured from the composite material sheet. The housing body is manufactured in a three-dimensional plate shape by using a mold as a compression molding unit. Since a post-treatment process such as such as coloring, dyeing, or depositing is previously performed on the surface-treated sheet to realize an elegant exterior, and then the surface-treated sheet defines the exterior of the housing body, a separate surface post-treatment process is unnecessary.

In operation S650, a plastic injection-molded product formed of the same material as the plastic sheet is molded on the plastic sheet of the housing body through insert molding. As described above, the plastic injection-molded product is formed of the same material as the plastic sheet. Thus, when the insert molding is performed, a bonded portion between the plastic sheet and the plastic injection-molded product are thermally fused and thus more firmly are coupled physically and chemically to each other. When the insert molding is performed, it is unnecessary to perform a separate process of applying an adhesive to attach the plastic injection-molded product to the housing body.

Figure 7:
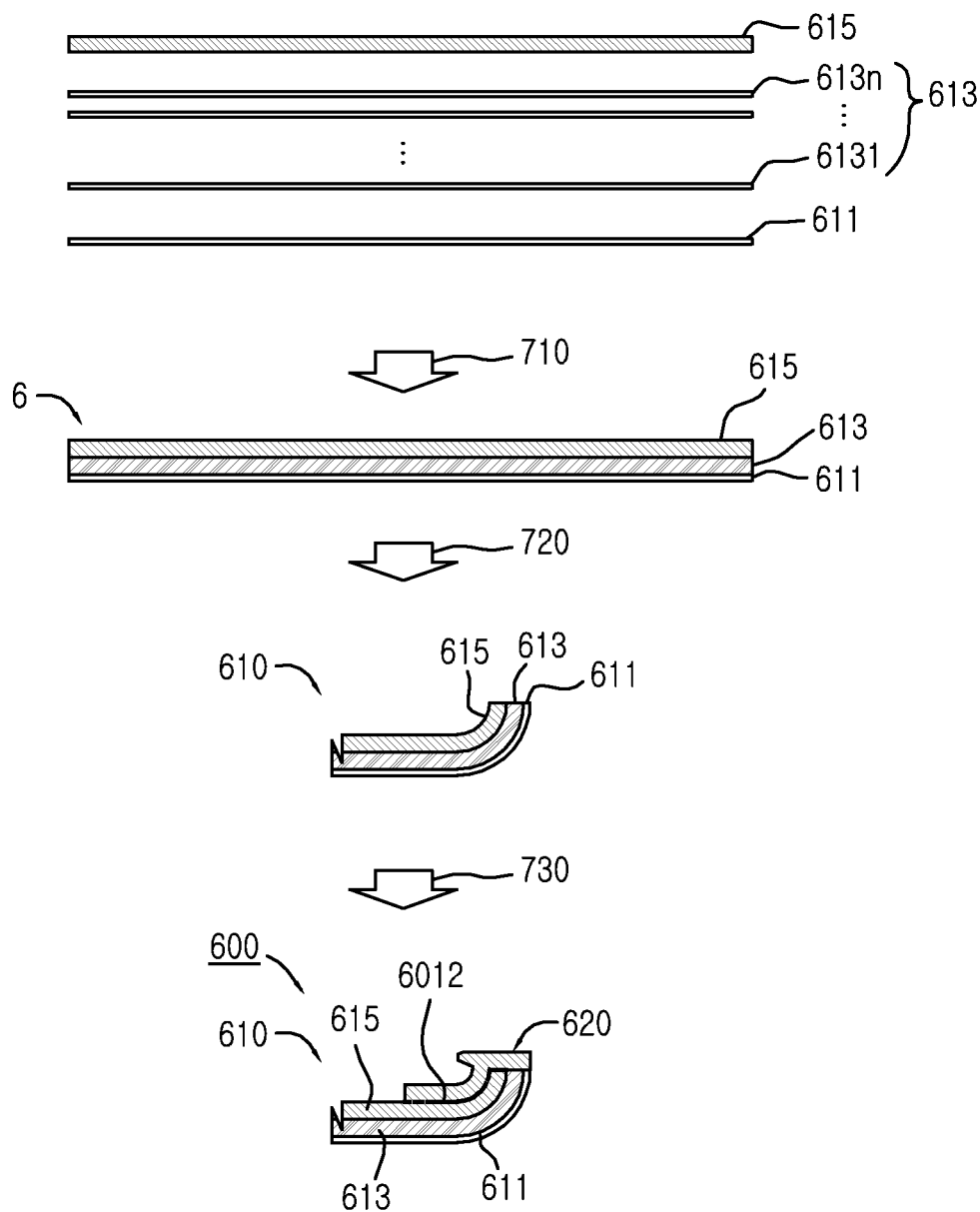
FIG. 7 is a view illustrating a process of manufacturing a housing according to an embodiment of the present invention.

FIG. 7 is a view illustrating a process of manufacturing the housing according to an embodiment of the present invention.

Referring to FIG. 7, a surface-treated sheet 611, at least one fiber base material 613, and a plastic sheet 615 are successively staked and attached in step 710 to each other to manufacture a composite material sheet 6 having a plate shape.

Then, the composite material sheet 6 is compression-molded in step 720 by using a mold to manufacture a housing body having a shape corresponding to that of the mold. The surface-treated sheet 611 is disposed on the outside of the housing body 610, and the plastic sheet 615 is disposed on the inside of the housing body 610. Since a post-treatment process such as such as coloring, dyeing, or depositing is previously performed on the surface-treated sheet 611 to realize an elegant exterior, and then the surface-treated sheet defines the exterior of the housing body, a separate surface post-treatment process is unnecessary.

Then, a plastic injection-molded product 620 is attached to an inner surface of the housing body 610 through insert molding to manufacture a housing 600. Since the molten plastic used for the insert molding is formed of the same material as the plastic sheet 615 disposed on the inside of the housing body 610, when the insert molding is performed, a bonded portion between the plastic sheet 615 and the plastic injection-molded product 620 are thermally fused and thus more firmly are coupled physically and chemically to each other into a unitary component. When the insert molding is performed, it is unnecessary to perform a separate process of applying an adhesive to attach the plastic injection-molded product to the housing body.

While the invention has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

According to the housing of the electronic device and the method of manufacturing the same, the number of post-treatment processes may be reduced to improve yield.

While the invention has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims and their equivalents. Therefore, the scope of the present invention should not be limited to the above-described embodiments but should be determined by not only the appended claims but also the equivalents thereof, and all differences within the scope will be construed as being included in the present invention.

What is claimed is:

1. A method of manufacturing a housing of an electronic device, the method comprising:
   manufacturing a housing body by successively stacking a composite material sheet with a plastic sheet applied to at least one surface of a top and a bottom surfaces of the composite material sheet, the housing body including an outer surface and an inner surface; and
   molding a plastic injection-molded product having a front face and a rear face onto the plastic sheet of the housing body through insert molding such that an entirety of the front face is affixed to the inner surface, the insert molding further connectively affixing the composite material sheet with the housing body and the plastic sheet,
   wherein the plastic injection-molded product includes openings, each opening exposing a portion of the inner surface of the housing body to provide additional space for electronic components housed in the electronic device, a particular opening of the openings comprising a quadrilateral form, and
   wherein the plastic-molded injection product is molded to include at least one slit extending from a vertex of the quadrilateral form towards a terminal edge of the inner surface of the housing body, and disposed diagonally relative to an edge of the quadrilateral, the at least one slit configured to prevent deformation of the housing body from contraction of the plastic injection-molded product.

2. The method of claim 1, wherein the plastic sheet of the housing body to which the insert molding is applied is formed of a same material as the plastic injection-molded product.

3. The method of claim 1, wherein a bonded portion between the plastic sheet of the housing body and the plastic injection-molded product is thermally fused to connectively affix the composite material sheet with the housing body and the plastic sheet.

4. The method of claim 1, wherein the plastic sheet is a surface-treated plastic sheet and wherein the surface-treated plastic sheet adhering to the housing body is disposed on the top surface of the composite material sheet, and
the plastic sheet adhering to the plastic injection-molded product is disposed on the bottom surface of the composite material sheet.

5. The method of claim 4, wherein a surface treatment of the surface-treated plastic sheet comprises at least one of coloring, dyeing, and depositing.

6. The method of claim 1, wherein the plastic injection-molded product has snap-fits disposed along a circumference of the housing body so that the snap-fits are detachably coupled to a coupling groove defined in a rear housing of the electronic device.

7. The method of claim 1, wherein the composite material sheet to which the plastic sheet is applied to the at least one surface of the top and bottom surfaces thereof is formed by successively stacking at least one fiber base material on one of the at least one surface of the top and bottom of the plastic sheet.

8. The method of claim 7, wherein the at least one fiber base material comprises at least one of a unidirectional prepreg, a plain weave prepreg, a twill woven prepreg, and a satin weave prepreg.

9. The method of claim 1, wherein the housing comprises a battery cover of the electronic device.

10. The method of claim 1, wherein the plastic sheet of the body to which the insert molding is applied is formed of a same material as the plastic injection-molded product.

11. The method claim 1, wherein a bonded portion between the plastic sheet of the housing body and the plastic injection-molded product is thermally fused to connectively affix the composite material sheet with the housing body and the plastic sheet.

12. The method claim 1, wherein the plastic sheet is a surface-treated plastic sheet and wherein the surface-treated plastic sheet adhering to the housing body is disposed on the top surface of the composite material sheet, and
the plastic sheet adhering to the plastic injection-molded product is disposed on the bottom surface of the composite material sheet.

13. The method of claim 12, wherein a surface treatment of the surface-treated plastic sheet comprises at least one of coloring, dyeing, and depositing.

14. The method of claim 1, wherein the plastic injection-molded product has snap-fits disposed along a circumference of the housing body so that the snap-fits are detachably coupled to a coupling groove defined in a rear body housing of the electronic device.

15. The method of claim 1, wherein the composite material sheet to which the plastic sheet is applied to the at least one surface of the top and bottom surfaces thereof is formed by successively stacking at least one fiber base material on one of the at least one surface of the top and bottom of the plastic sheet.

16. The method of claim 15, wherein the fiber base material comprises at least one of a unidirectional prepreg, a plain weave prepreg, a twill woven prepreg, and a satin weave prepreg.

17. The method of claim 1, wherein the housing comprises a battery cover of the electronic device.

18. The method of claim 1, wherein the electronic device further comprises:
a front housing disposed on a front side of the electronic device, a rear housing coupled to the front housing to provide a space between the front housing and the rear housing for accommodating a plurality of electronic components of the electronic device, and a detachable rear cover disposed on a rear side of the electronic device, the detachable rear cover being coupled to the rear housing to provide a space accommodating a battery between the rear housing and the rear cover,
the method further comprising manufacturing the rear cover by:
successively stacking a composite material sheet with a plastic sheet applied to each of a top and a bottom surfaces of the composite material sheet to manufacture a body; and
insert molding a plastic injection-molded product molded onto the plastic sheet disposed on the bottom surface of the body to connectively affix the composite material sheet with the housing body and the plastic sheet, the plastic injection-molded product having snap-fits on a circumference thereof so that the snap-fits are detachably coupled to a coupling groove defined in the rear housing,
wherein the plastic sheet is a surface-treated plastic sheet and wherein the surface-treated plastic sheet adhering to the housing body is disposed on the top surface of the body comprises a surface-treated sheet, and
wherein the plastic sheet disposed on the bottom surface of the body and the plastic injection-molded product are the same material, and a bonded portion between the plastic sheet and the plastic injection-molded product is thermally fused to connectively affix the composite material sheet with the housing body and the plastic sheet.

19. The method of claim 18, wherein the composite material sheet to which the plastic sheet is applied to the at least one surface of the top and bottom surfaces thereof is formed by successively stacking at least one fiber base material on one of the at least one surface of the top and bottom of the plastic sheet.

* * * * *